United States Patent
Nakajima

(10) Patent No.: US 8,508,901 B2
(45) Date of Patent: Aug. 13, 2013

(54) OVERCURRENT DETECTION CIRCUIT

(75) Inventor: Sakae Nakajima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 575 days.

(21) Appl. No.: 12/461,472

(22) Filed: Aug. 12, 2009

(65) Prior Publication Data
US 2010/0067161 A1    Mar. 18, 2010

(30) Foreign Application Priority Data
Sep. 12, 2008   (JP) .................. 2008-234645

(51) Int. Cl.
*H02H 3/08*     (2006.01)
*H03K 17/082*   (2006.01)

(52) U.S. Cl.
CPC .............................. *H03K 17/0822* (2013.01)
USPC ............................................................ 361/93.1

(58) Field of Classification Search
USPC ................................................ 361/93.1
See application file for complete search history.

(56) References Cited

U.S. PATENT DOCUMENTS

| | | | |
|---|---|---|---|
| 4,376,251 A * | 3/1983 | Kobayashi et al. | 327/165 |
| 6,154,097 A * | 11/2000 | Yoshioka | 331/18 |
| 7,259,951 B2 | 8/2007 | Arai | |
| 7,626,792 B2 * | 12/2009 | Mitsuda | 361/93.1 |
| 2003/0117758 A1 | 6/2003 | Yoshida et al. | |
| 2005/0013079 A1 | 1/2005 | Mitsuda | |
| 2007/0229041 A1 | 10/2007 | Oki et al. | |

FOREIGN PATENT DOCUMENTS

| | | |
|---|---|---|
| CN | 1576859 A | 2/2005 |
| CN | 1954469 A | 4/2007 |
| JP | 2005-39573 | 2/2005 |

OTHER PUBLICATIONS

Horowitz et al., The Art of Electronics, 2006, The Press Syndicate of the University of Cambridge, Second Edition, 118-119 and 263-281.*
Chinese Office Action dated Nov. 29, 2012 with English translation.
Chinese Office Action dated Apr. 11, 2013 with English translation.

* cited by examiner

*Primary Examiner* — Rexford Barnie
*Assistant Examiner* — Tien Mai
(74) *Attorney, Agent, or Firm* — McGinn IP Law Group, PLLC

(57) ABSTRACT

An overcurrent detection circuit in accordance with an exemplary aspect of the present invention includes a detection transistor, a potential difference setting unit, and a first transistor whose current value is controlled by the potential difference setting unit. Further, the potential difference setting unit includes a first depletion type transistor, a power-supply voltage being supplied to the drain of the first depletion type transistor, and the gate and source of the first depletion type transistor being connected to the gate of the first transistor, a second transistor, the drain and gate of the second transistor being connected to the gate of the first transistor, and a second depletion type transistor provided on the current path between the sources of the first transistor and the second transistor, the gate and drain of the second depletion type transistor being connected to the source of the detection transistor.

18 Claims, 9 Drawing Sheets

OVERCURRENT DETECTION CIRCUIT

BACKGROUND

1. Field of the Invention

The present invention relates to an overcurrent detection circuit, in particular to a technique for improving the accuracy of current detection.

2. Description of Related Art

In recent years, replacements from mechanical relays in the related art to power MOSFETs equipped with control circuits, i.e., IPDs (Intelligent Power Devices) as switch elements for driving loads such as lamps and motors in vehicles such as cars have been in progress in order to achieve higher reliability/lower on-resistance/lower costs. In a system provided with a load and an IPD, for example, if an abnormal condition such as short-circuit of wiring or the load occurs and thereby an overcurrent flows into the load, there is a possibility that a power MOSFET provided in the IPD and the load will be damaged. It has been therefore common practice to provide the IPD with a circuit that detects an overcurrent and turns off the power MOSFET before these components are damaged, i.e., with an overcurrent detection circuit. Further, it has been also desired that current-detection-value characteristics of such overcurrent detection circuits have high accuracy so that the loads and the power MOSFETs are protected more safely. That is, it has been desired to reduce errors caused by variations in the characteristics of each component.

Japanese Unexamined Patent Application Publication No. 2005-039573 proposes a solution for this problem. FIG. 9 shows a load drive circuit (overcurrent detection circuit) disclosed in Japanese Unexamined Patent Application Publication No. 2005-039573. The circuit shown in FIG. 9 includes a power-supply voltage terminal 1, a load 2, an input terminal 3, an output terminal 4, a control circuit 5, a ground voltage terminal 6, constant-current output means 9, threshold current output means 10, an output MOS transistor Q1, a current detection MOS transistor Q2, a detection voltage transfer MOS transistor Q3, a detection signal output MOS transistor Q4, and a detection resistor Rs. Note that the transistors Q2, Q3 and Q4, the control circuit 5, the detection resistor Rs, the constant-current output means 9, and the threshold current output means 10 constitute a load drive circuit. Note that the circuit in FIG. 9 has a function for detecting an overcurrent between the source and drain of the transistor Q1 when the power-supply voltage is supplied from the power-supply voltage terminal 1 to the load 2. In particular, the circuit in FIG. 9 is characterized in that it can detect an overcurrent even when the potential at the output terminal 4 is lower than the potential at the ground voltage terminal.

The structure of the circuit shown in FIG. 9 is briefly explained hereinafter. The power-supply voltage terminal 1 is connected through the input terminal 3 to the drains of Q1 and Q2, and to the input terminals of the constant-current output means 9 and the threshold current output means 10. The power-supply voltage terminal on the high-potential side of the load 2 is connected through the output terminal 4 to a node 8. The node 8 is also connected to the source of the transistor Q1, one terminal of the detection resistor Rs, and the source of the transistor Q4. Furthermore, the power-supply voltage terminal on the low-potential side of the load 2 is connected to the ground voltage terminal 6.

The output terminal of the control circuit 5 is connected to the gates of the transistors Q1 and Q2. The source of the transistor Q2 is connected to a node 7. The node 7 is also connected to the other terminal of the detection resistor Rs and the source of the transistor Q3. The output terminal of the constant-current output means 9 is connected to a node 11. The note 11 is also connected to the drain and the gate of the transistor Q3 and the gate of the transistor Q4. The output terminal of the threshold current output means 10 is connected to a node 12. The node 12 is also connected to the drain of the transistor Q4 and the output terminal from which an overcurrent detection signal is output.

Next, the operations of the circuit in FIG. 9 are explained hereinafter. The switching between On/Off states of the power-supply voltage supplied from the power-supply voltage terminal 1 to the load 2 is controlled by the transistor Q1. That is, the connection between the source and drain of the transistor Q1 is controlled by a control signal output from the control circuit 5.

Since the transistors Q1 and Q2 are structurally similar to each other (only the dimensions are different, and characteristics per unit channel width are equivalent), a current flowing through the transistor Q2 increases with the increase in a current flowing through the transistor Q1 based on the homothetic ratio between the transistors Q1 and Q2 (for example, if the current flowing through the transistor Q1 is 10 A and the homothetic ratio is 10000:1, the current flowing through the transistor Q2 becomes 10 A/10000=1 mA). As a result, the potential Vs at the node 7 and the potential V1 at the node 11 rise. That is, when the transistor Q4 is turned on, the current flowing therethrough becomes larger. Note that the transistors Q3 and Q4 are structurally similar to each other.

When a current flowing between the source and drain of this transistor Q4 exceeds a threshold current Iref2 (e.g., 50 uA) established by the threshold current output means 10, an overcurrent detection signal output through the node 12 is inverted from the high level to the low level. Therefore, the load drive circuit can determine that the current flowing into the load is in an overcurrent state.

On the other hand, when the current flowing through the transistor Q1 is small, the current that flows when the transistor Q4 is turned on is smaller than the threshold current Iref2. At this time, the overcurrent detection signal output through the node 12 remains in the high-level state. Therefore, the load drive circuit can determine that the current flowing into the load is not in an overcurrent state.

Note that as shown in Japanese Unexamined Patent Application Publication No. 2005-039573, in addition to the relation between the transistors Q1 and Q2 and the relation between the transistors Q3 and Q4, the constant-current output means 9, which outputs the signal Iref1, and the threshold current output means 10, which outputs the signal Iref2, are also structurally similar to each other.

We had examined the operations of the circuit shown in FIG. 9 in detail. To explain the circuit in FIG. 9, an assumption is made that the current flowing through Q1 is Ioc, the current flowing through Q2 is Isense, the homothetic ratio between Q1 and Q2 is A:1, the channel length of Q3 is L1, the channel width of Q3 is w1, the channel length of Q4 is L2, the channel width of Q4 is w2, the threshold voltage of Q3 and Q4 is Vt, the mobility of electrons is μ, and the oxide film capacitance per unit area is Cox. Note that Isense is sufficiently larger than Iref1. In the circuit of FIG. 9, the current value Ioc detected by the load drive circuit can be expressed by the following Equation (1).

$$V1 = Isense \cdot Rs + \sqrt{\frac{2L1}{\mu \cdot Cox \cdot w1} Iref1} + Vt$$

$$= \sqrt{\frac{2L2}{\mu \cdot Cox \cdot w2} Iref2} + Vt$$

-continued $$Isense = \frac{1}{Rs}\sqrt{\frac{2}{\mu \cdot Cox}}\left(\sqrt{\frac{L2}{w2}Iref2} - \sqrt{\frac{L1}{w1}Iref1}\right)$$

Since Ioc=A·Isense, the following equation is obtained.

$$Ioc = \frac{A}{Rs}\sqrt{\frac{2}{\mu \cdot Cox}}\left(\sqrt{\frac{L2}{w2}Iref2} - \sqrt{\frac{L1}{w1}Iref1}\right) \quad (1)$$

Assuming that, in Equation (1), the variation coefficient of Iref1 is x, the variation coefficient of Iref2 is y, and the variation coefficient of Rs is z, it can be expressed as the following Equation (2). Note that if the variation coefficient is 1, its variation characteristic indicates a standard value.

$$Ioc = \frac{A}{Rs \cdot z}\sqrt{\frac{2}{\mu \cdot Cox}}\left(\sqrt{\frac{L2}{w2}Iref2 \cdot y} - \sqrt{\frac{L1}{w1}Iref1 \cdot x}\right) \quad (2)$$

Note that since the constant-current output means 9 and the threshold current output means 10 are structurally similar to each other in the related art, variation coefficients of Iref1 and Iref2 are equal. That is, an equation x=y is satisfied. Therefore, Equation (2) can be expressed as follows.

$$Ioc(x, z) = \frac{A}{Rs \cdot z}\sqrt{\frac{2}{\mu \cdot Cox}}\left(\sqrt{\frac{L2}{w2}Iref2 \cdot x} - \sqrt{\frac{L1}{w1}Iref1 \cdot x}\right)$$

Accordingly, the variation coefficient of Ioc is expressed as follows.

$$\frac{Ioc(x, z)}{Ioc(1, 1)} = \frac{\sqrt{x}}{z} \quad (3)$$

In this example, if each component has a variation within ±20%, i.e., if the variations occur within a range of x=0.8-1.2 and z=0.8-1.2, the maximum value and the minimum value of the variation coefficient of Ioc can be expressed as follows.

$$\text{maximum value: } \frac{Ioc(x, z)}{Ioc(1, 1)} = \frac{\sqrt{1.2}}{0.8} = 1.3693\ldots \approx 1.369$$

$$\text{minimum value: } \frac{Ioc(x, z)}{Ioc(1, 1)} = \frac{\sqrt{0.8}}{1.2} = 0.7454\ldots \approx 0.745$$

That is, the current value Ioc detected by the load drive circuit (the overcurrent detection value) exhibits a large variation with a range of +36.9% to −25.5% (variation width=62.4%).

SUMMARY

The present inventors have found a problem that, as described above, overcurrent detection circuits in the related art have a problem that they have larger errors in the overcurrent detection values due to variations in the characteristics of each component.

A first exemplary aspect of the present invention is an overcurrent detection circuit including: a detection transistor (e.g., current detection MOS transistor Q2 in a first exemplary embodiment of the present invention) whose current value is controlled according to a control voltage applied to a gate terminal of an output transistor (e.g., output MOS transistor Q1 in a first exemplary embodiment of the present invention), the output transistor being configured to control an electrical power supply to a load; a potential difference setting unit for which a potential difference of output voltages is controlled according to a current value of the detection transistor; and a first transistor (e.g., detection signal output MOS transistor Q4 in a first exemplary embodiment of the present invention) whose current value is controlled according to a potential difference between its gate and source terminals, the potential difference between the gate and source terminals being controlled by the potential difference setting unit, wherein the overcurrent detection circuit detects an overcurrent based on a current value of the first transistor, and the potential difference setting unit includes: a first depletion type transistor (e.g., GS-shorted depletion MOS transistor Q6 in a first exemplary embodiment of the present invention), a supply voltage (e.g., a power-supply voltage in a first exemplary embodiment of the present invention) being applied to a drain terminal of the first depletion type transistor, and gate and source terminals of the first depletion type transistor being connected to the gate terminal of the first transistor; a second transistor (e.g., detection voltage transfer MOS transistor Q3 in a first exemplary embodiment of the present invention), drain and gate terminals of the second transistor being connected to a node between the gate and source terminals of the first depletion type transistor and the gate terminal of the first transistor; and a second depletion type transistor (e.g., GD-shorted depletion MOS transistor Q5 in a first exemplary embodiment of the present invention) provided on a current path between the source terminal of the first transistor and the source terminal of the second transistor, gate and drain terminals of the second depletion type transistor being connected to a source terminal of the detection transistor, and a source terminal of the second depletion type transistor being connected to an output terminal to the load.

With a configuration described above, it is possible to reduce an error in an overcurrent detection value due to variations in the characteristics of each component.

The present invention can provide an overcurrent detection circuit capable of reducing an error in an overcurrent detection value due to variations in the characteristics of each component.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Specific exemplary embodiments to which the present invention is applied are explained hereinafter in detail with reference to the drawings.

First Exemplary Embodiment

Figure 1:
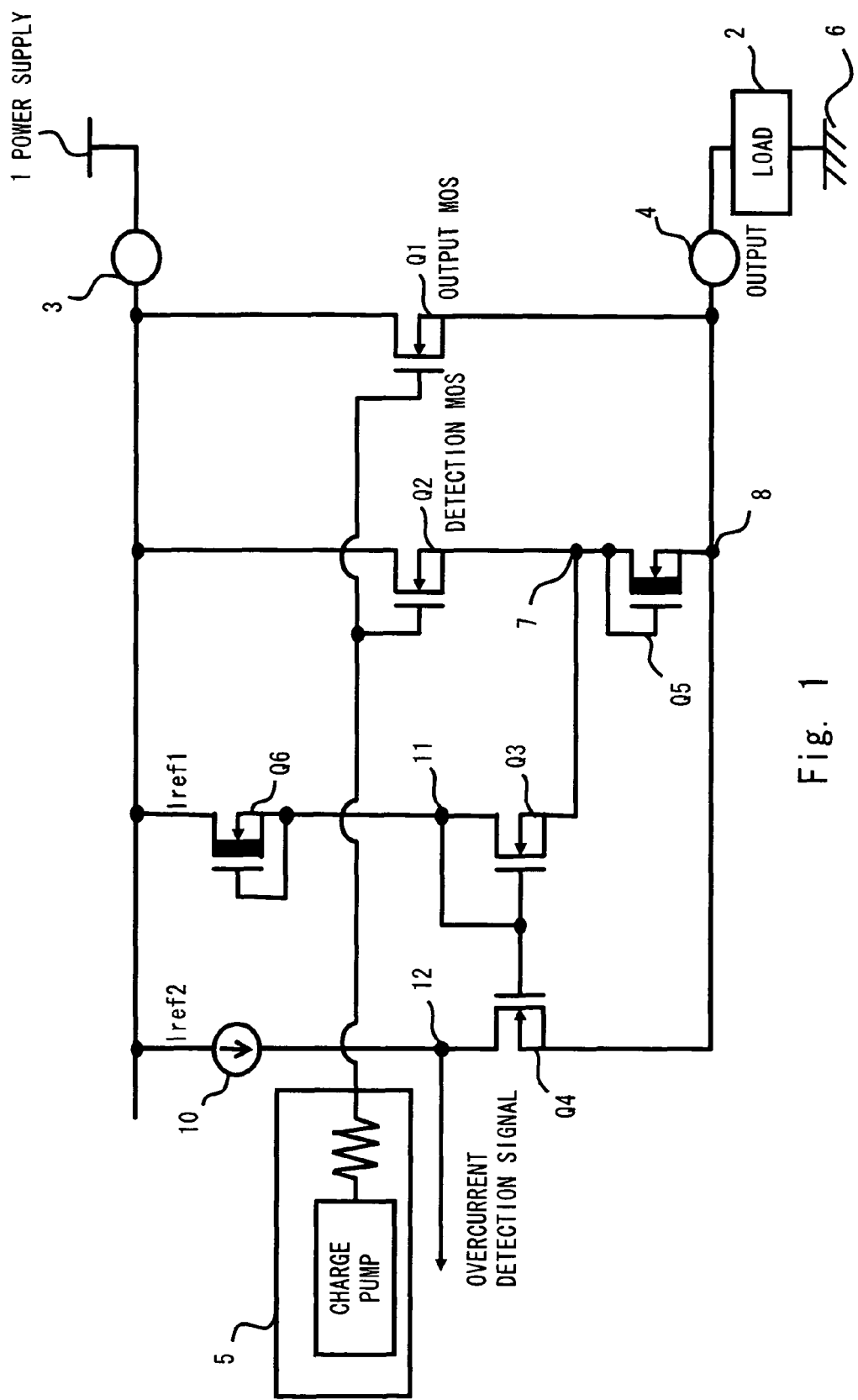
FIG. 1 shows an overcurrent detection circuit in accordance with a first exemplary embodiment of the present invention.

FIG. 1 shows an overcurrent detection circuit in accordance with a first exemplary embodiment of the present invention. The circuit shown in FIG. 1 includes a GS-shorted depletion MOS transistor (first depletion type transistor) Q6 that exhibits a constant-current characteristic as constant-current output means 9 in contrast to the related-art circuit shown in FIG. 9. Furthermore, it also includes a GD-shorted depletion MOS transistor (second depletion type transistor) Q5 that is a structurally similar transistor to the transistor Q6 and exhibits a resistance characteristic in place of the detection resistor Rs. Note that the transistor Q5 is a depletion type MOS transistor whose gate and drain are connected to each other. Note also that transistor Q6 is a depletion type MOS transistor whose gate and source are connected to each other.

The circuit shown in FIG. 1 includes a power-supply voltage terminal (power-supply) 1, a load 2, an input terminal 3, an output terminal 4, a control circuit 5, a ground voltage terminal 6, a GS-shorted depletion MOS transistor Q6, threshold current output means (threshold current output unit) 10, an output MOS transistor (output transistor) Q1, a current detection MOS transistor (detection transistor) Q2, a detection voltage transfer MOS transistor (second transistor) Q3, a detection signal output MOS transistor (first transistor) Q4, and a GD-shorted depletion MOS transistor Q5. Note that the transistors Q2, Q3 and Q4, the transistors Q5 and Q6, the control circuit 5, and the threshold current output means 10 constitute an overcurrent detection circuit. Furthermore, the transistors Q3, Q5 and Q6 constitute a potential difference setting unit. Note that similarly to the related-art circuit shown in FIG. 9, the overcurrent detection circuit shown in FIG. 1 has a function for detecting a current flowing between the source and drain of the transistor Q1 when the power-supply voltage is supplied from the power-supply voltage terminal 1 to the load 2.

Firstly, the structure of the circuit shown in FIG. 1 is explained hereinafter. The power-supply voltage terminal 1 is connected through the input terminal 3 to the drains of Q1 and Q2, the drain of the transistor Q6, and the input terminal of the threshold current output means 10. The power-supply voltage terminal on the high-potential side of the load 2 is connected through the output terminal 4 to a node 8. The node 8 is also connected to the sources of the transistors Q1, Q5 and Q4. Furthermore, the ground voltage terminal 6 is connected to the power-supply voltage terminal on the low-potential side of the load 2.

The output terminal of the control circuit 5 is connected to the gates of the transistors Q1 and Q2. The source of the transistor Q2 is connected to a node 7. The node 7 is also connected to the source of the transistor Q3, and the drain and gate of the transistor Q5. The source of the transistor Q6 is connected to a node 11. The note 11 is also connected to the drain and gate of the transistor Q3, the gate of the transistor Q4, and the gate of the transistor Q6. The output terminal of the threshold current output means 10 is connected to a node 12. The node 12 is also connected to the drain of the transistor Q4 and the output terminal from which an overcurrent detection signal is output.

Next, the operations of the circuit in FIG. 1 are explained hereinafter. The switching between On/Off states of the power-supply voltage supplied from the power-supply voltage terminal 1 to the load 2 is controlled by the transistor Q1. That is, the connection between the source and drain of the transistor Q1 is controlled by a control signal output from the control circuit 5.

Since the transistors Q1 and Q2 are structurally similar to each other, a current flowing through the transistor Q2 increases with the increase in a current flowing through the transistor Q1 based on the homothetic ratio between the transistors Q1 and Q2 (for example, if the current flowing through the transistor Q1 is 10 A and the homothetic ratio is 10000:1, the current flowing through the transistor Q2 becomes 10 A/10000=1 mA). As a result, the potential Vs at the node 7 and the potential V1 at the node 11 rise. That is, when the transistor Q4 is turned on, the current flowing therethrough becomes larger. Note that the transistors Q3 and Q4 are structurally similar to each other.

When a current flowing between the source and drain of this transistor Q4 exceeds a threshold current Iref2 (e.g., 50 uA) established by the threshold current output means 10, an overcurrent detection signal output through the node 12 is inverted from the high level to the low level. Therefore, the overcurrent detection circuit shown in FIG. 1 can determine that the current flowing into the load is in an overcurrent state.

On the other hand, when the current flowing through the transistor Q1 is small, the current that flows when the transistor Q4 is turned on is smaller than the threshold current Iref2. At this time, the overcurrent detection signal output through the node 12 remains in the high-level state. Therefore, the overcurrent detection circuit shown in FIG. 1 can determine that the current flowing into the load is not in an overcurrent state.

Figure 2:
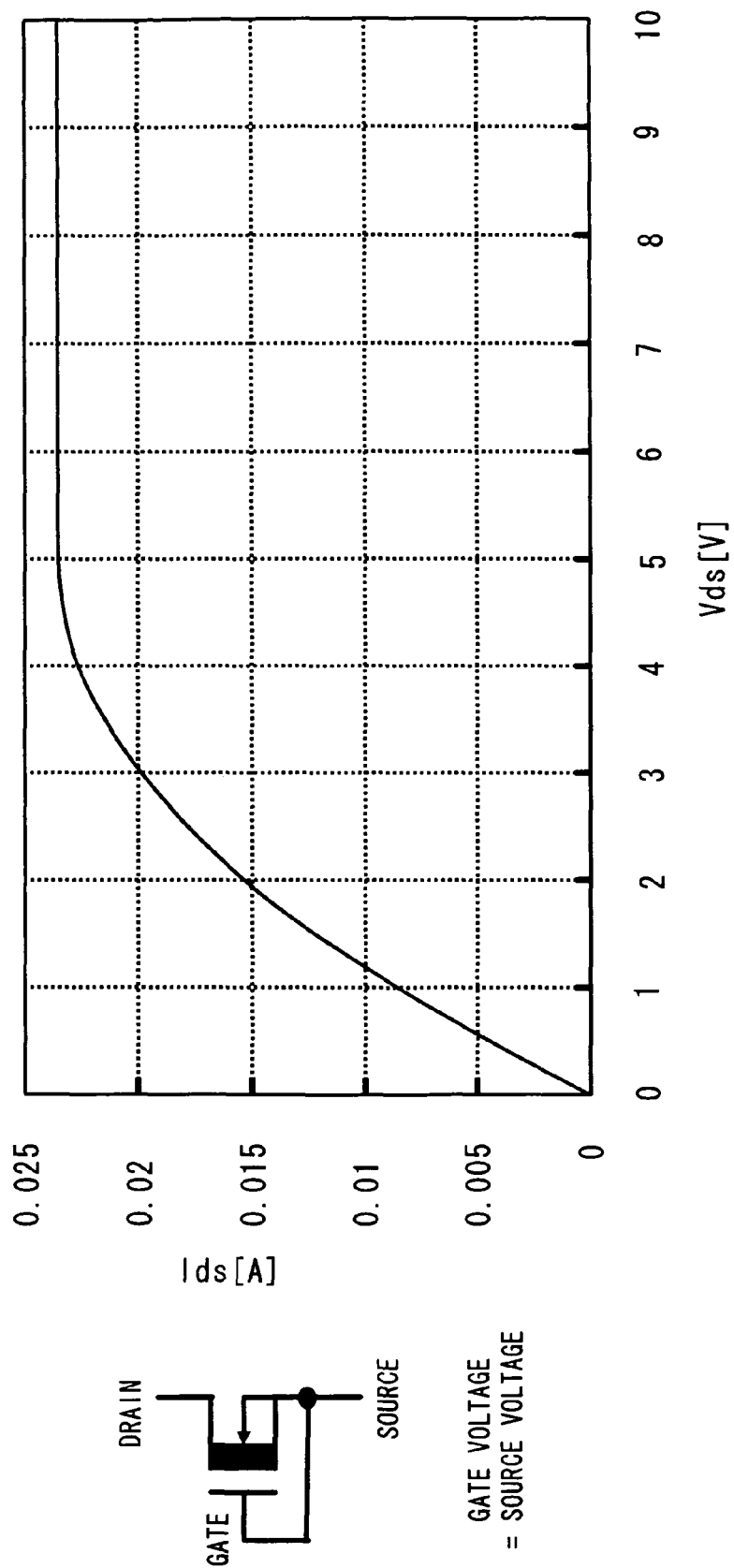
FIG. 2 shows a connection configuration and an example of a VI characteristic of a GS-shorted depletion MOS transistor.
Figure 3:
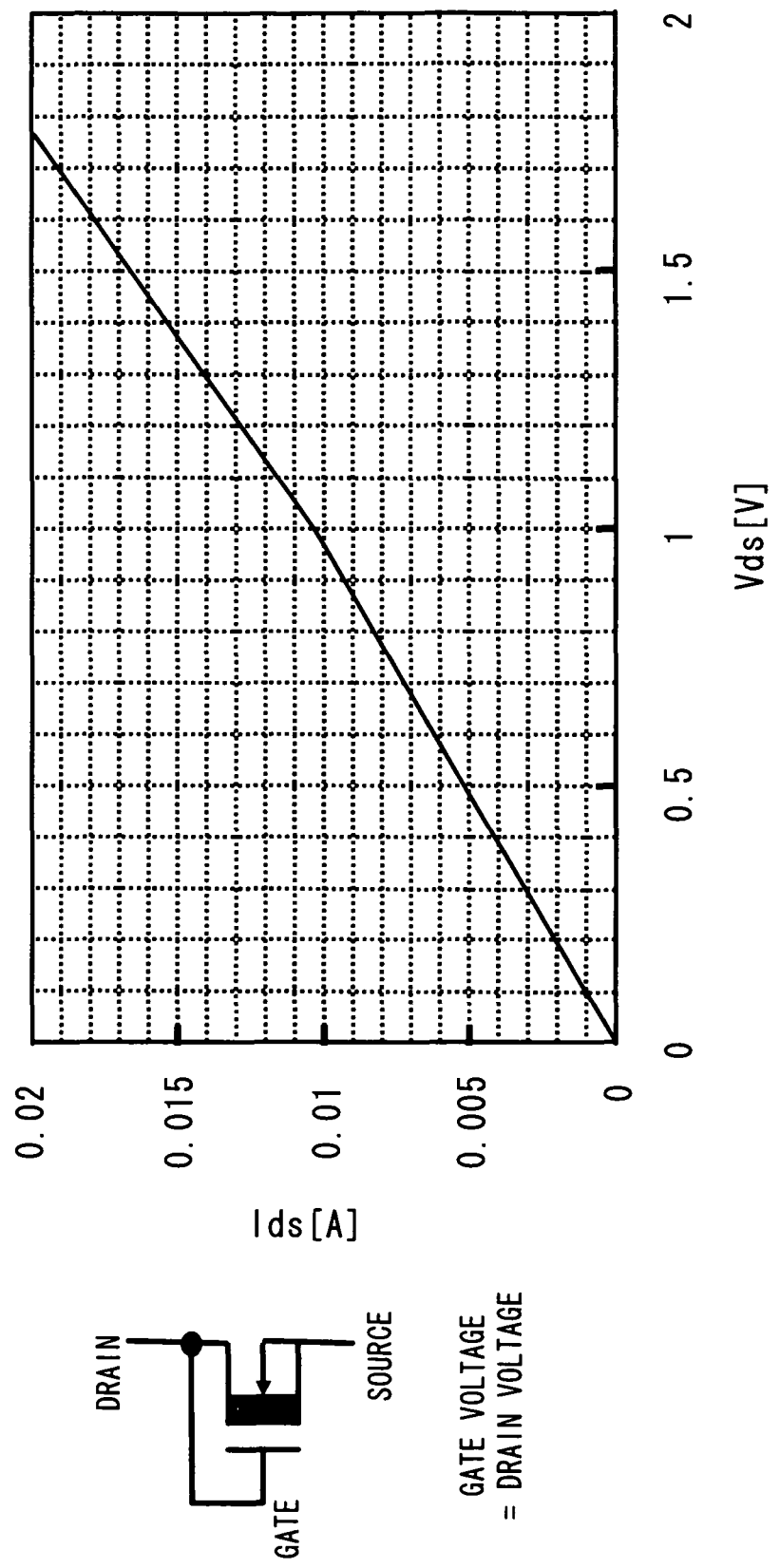
FIG. 3 shows a connection configuration and an example of a VI characteristic of a GD-shorted depletion MOS transistor.

Characteristics of a depletion type MOS transistor are explained hereinafter. FIG. 2 shows an example of a VI characteristic of a GS-shorted depletion MOS transistor. Further, FIG. 3 shows an example of a VI characteristic of a GD-shorted depletion MOS transistor. As shown in FIG. 2, the GS-shorted depletion MOS transistor exhibits a constant-current characteristic. Further, as shown in FIG. 3, the GD-shorted depletion MOS transistor exhibits a resistance characteristic. These characteristics can be expressed by the respective equations described below.

Firstly, the constant-current characteristic of a GS-shorted depletion MOS transistor is explained hereinafter. A current $I_{ds}$ flowing between the source and drain in the saturation region can be generally expressed by the following equation. Note that an assumption is made that the channel length of a GS-shorted depletion MOS transistor is L, the channel width is w, the threshold voltage is Vt, the voltage between the gate and source is Vgs, the mobility of electrons is μ, and the oxide film capacitance per unit area is Cox. Assume the following relation.

$$k = \frac{\mu \cdot Cox \cdot w}{2L}$$

Then, the following equation is established.

$$Ids = k \cdot (Vgs - Vt)^2$$

Since Vgs=0, it is expressed by the following equation.

$$Ids = k \cdot Vt^2$$

$$Ids \propto Vt^2$$

That is, the constant-current characteristic of a GS-shorted depletion MOS transistor is in proportion to the square of Vt.

Next, the resistance characteristic of a GD-shorted depletion MOS transistor is explained hereinafter. A current Ids flowing between the source and drain in the linear region can be generally expressed by the following equation. Note that an assumption is made that the channel length of a GD-shorted depletion MOS transistor is L, the channel width is w, the threshold voltage is Vt, the voltage between the gate and source is Vgs, the voltage between the drain and source is Vds, the resistive component between the drain and source is R, the mobility of electrons is μ, and the oxide film capacitance per unit area is Cox. Assume the following relation.

$$k = \frac{\mu \cdot Cox \cdot w}{2L}$$

Then, the following equation is established.

$$Ids = k\{2(Vgs-Vt) \cdot Vds - Vds^2\}$$

Since Vgs=Vds, it can be expressed as follows.

$$Ids = k(Vds^2 - 2Vt \cdot Vds)$$

$$Vds = Vt + \sqrt{Vt^2 + \frac{Ids}{k}}$$

Therefore, the following equation is established.

$$R = \frac{d\,Vds}{d\,Ids} = \frac{1}{2k(Vds - Vt)}$$

If a relation −Vt≫Vds is satisfied based on the characteristics of the depletion MOS transistor and the operating conditions (e.g., Vt=−5V, Vds=0.1V), it can be expressed as follows.

$$R = \frac{1/Vt}{2k(Vds/Vt - 1)} \approx \frac{1}{-2k \cdot Vt}$$

$$R \propto \frac{1}{Vt}$$

That is, the resistance characteristic of a GD-shorted depletion MOS transistor is in inverse proportion to Vt. For example, if the source-drain current Ids of a GS-shorted depletion MOS transistor is increased by a factor of 1.44 due to the variation in Vt, the resistive component R of a structurally similar GD-shorted depletion MOS transistor is decreased by a factor of 1.2.

Next, a current value Ioc in the circuit shown in FIG. 1 is explained hereinafter. Assume that the variation coefficient of Iref1 is x and the variation coefficient of the resistive component Rs of the transistor Q5 is z. Then, from the fact that the GS-shorted depletion MOS transistor and the GD-shorted depletion MOS transistor are structurally similar to each other, the following equation is established with regard to the variation coefficient z of Rs. Note that an assumption is made that the current flowing through Q1 is Ioc, the current flowing through Q2 is Isense, the homothetic ratio between Q1 and Q2 is A:1, the channel length of Q3 is L1, the channel width of Q3 is w1, the channel length of Q4 is L2, the channel width of Q4 is w2, the threshold voltage of Q3 and Q4 is Vt, the mobility of electrons is μ, and the oxide film capacitance per unit area is Cox. Note that Isense is sufficiently larger than Iref1.

$$z = \frac{1}{\sqrt{x}}$$

Therefore, Equation (2) expressing the current value Ioc detected by the overcurrent detection circuit can be expressed as follows.

$$Ioc(x,y) = \frac{A \cdot \sqrt{x}}{Rs} \sqrt{\frac{2}{\mu \cdot Cox}} \left( \sqrt{\frac{L2}{w2} Iref2 \cdot y} - \sqrt{\frac{L1}{w1} Iref1 \cdot x} \right)$$

$$Ioc(x,y) = \frac{A}{Rs} \sqrt{\frac{2}{\mu \cdot Cox}} \left( \sqrt{\frac{L2}{w2} Iref2} \cdot \sqrt{x \cdot y} - \sqrt{\frac{L1}{w1} Iref1} \cdot x \right)$$

Assume the following relation.

$$\gamma = \frac{A}{Rs} \sqrt{\frac{2}{\mu \cdot Cox}},\ \alpha = \sqrt{\frac{L2}{w2} Iref2},\ \beta = \sqrt{\frac{L1}{w1} Iref1}$$

Then, the following equation is established.

$$Ioc(x,y) = \gamma(\alpha\sqrt{x \cdot y} - \beta \cdot x)$$

Therefore, the variation coefficient of Ioc can be expressed as follows.

$$\frac{Ioc(x,y)}{Ioc(1,1)} = \frac{\gamma(\alpha\sqrt{x \cdot y} - \beta \cdot x)}{\gamma(\alpha - \beta)}$$

Assuming the relation α/β=m, it can be expressed as follows.

$$\frac{Ioc(x,y)}{Ioc(1,1)} = \frac{\sqrt{x \cdot y} - \frac{x}{m}}{1 - \frac{1}{m}}$$

Therefore, if s relation α≫β is satisfied, i.e., if m is sufficiently large, it can be approximated by the following equation.

$$\frac{Ioc(x,y)}{Ioc(1,1)} \approx \sqrt{x \cdot y} \quad (4)$$

In this example, if each component has a variation within ±20%, i.e., if the variations occur within a range of x=0.8-1.2 and y=0.8-1.2, the maximum value and the minimum value of the variation coefficient of Ioc can be expressed as follows.

$$\text{maximum value: } \frac{Ioc(x, y)}{Ioc(1, 1)} = \sqrt{1.2 \cdot 1.2} = 1.2$$

$$\text{minimum value: } \frac{Ioc(x, y)}{Ioc(1, 1)} = \sqrt{0.8 \cdot 0.8} = 0.8$$

Figure 9:
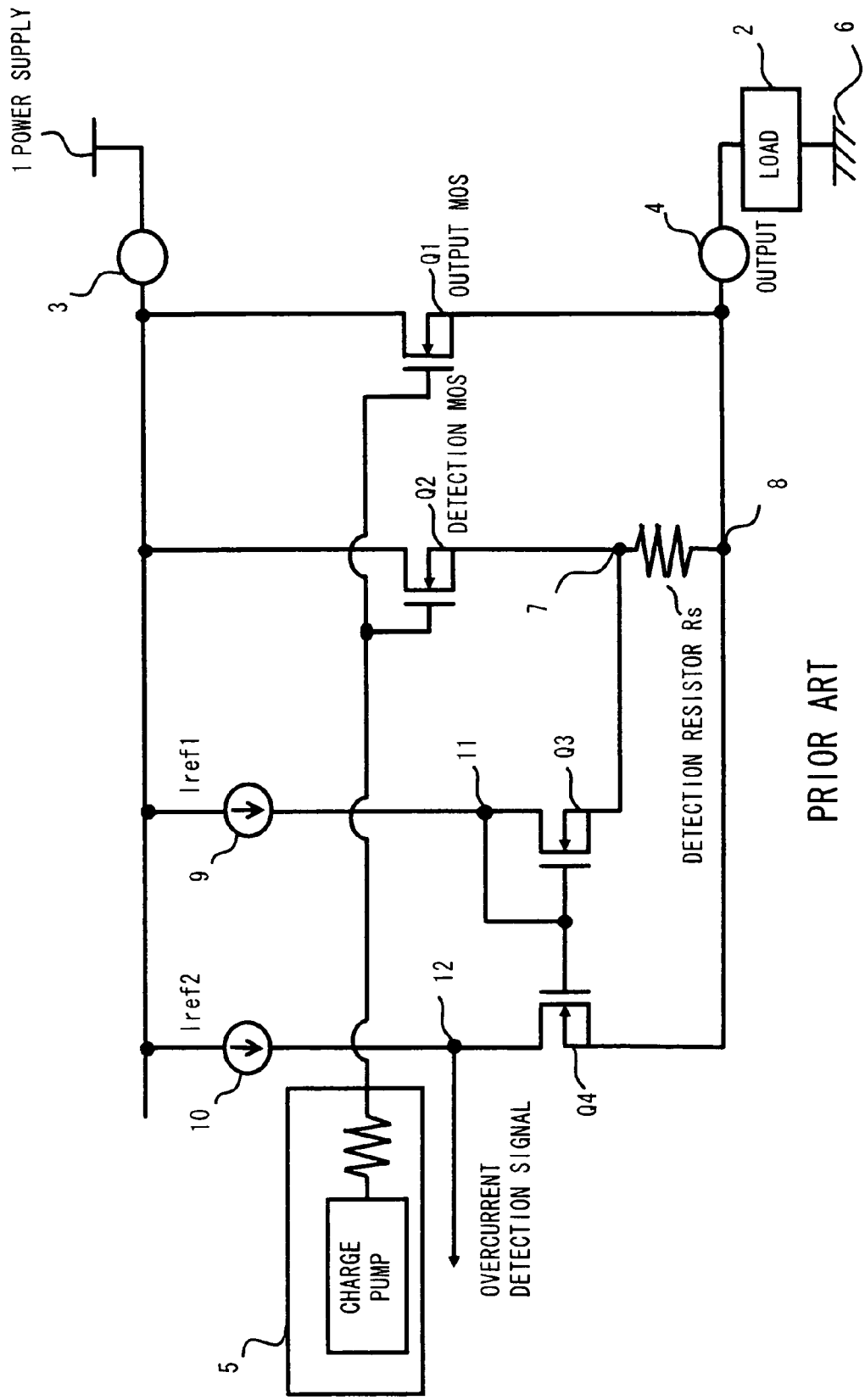
FIG. 9 shows an overcurrent detection circuit in the related art.

That is, the current value Ioc detected by the overcurrent detection circuit (the overcurrent detection value) exhibits variations within a range of +20.0% to −20.0% (variation width=40.0%). As described above, the variation width of the related-art circuit shown in FIG. 9 is 62.4%. Therefore, the variation width of an overcurrent detection circuit in accordance with a first exemplary embodiment of the present invention is improved in the accuracy over that of the related art by 22.4%.

The prerequisite for achieving the improvement in accuracy of the circuit shown in FIG. 1 over the related-art circuit shown in FIG. 9 is summarized hereinafter. Assume the minimum value is xmin and the maximum value is xmax for the common variation coefficient x of Iref1. Assume also the minimum value is ymin and the maximum value is ymax for the common variation coefficient y of Iref2. Assume also the minimum value is zmin and the maximum value is zmax for the variation coefficient z of Rs. Then, the maximum value, the minimum value, and variation width of the variation coefficient of Ioc in the related-art circuit shown in FIG. 9 can be expressed as follows.

$$\text{maximum value: } \frac{\sqrt{x_{max}}}{z_{min}},$$

$$\text{minimum value: } \frac{\sqrt{x_{min}}}{z_{max}},$$

$$\text{variation width: } \frac{\sqrt{x_{max}}}{z_{min}} - \frac{\sqrt{x_{min}}}{z_{max}}$$

Further, the maximum value, the minimum value, and variation width of the variation coefficient of Ioc in the circuit shown in FIG. 1 can be expressed as follows.

$$\text{maximum value: } \sqrt{x_{max} \cdot y_{max}},$$

$$\text{minimum value: } \sqrt{x_{min} \cdot y_{min}},$$

$$\text{variation width: } \sqrt{x_{max} \cdot y_{max}} - \sqrt{x_{min} \cdot y_{min}}$$

Therefore, the prerequisite for achieving the improvement in accuracy of the overcurrent detection circuit in accordance with a first exemplary embodiment of the present invention over the related-art circuit is expressed as follows.

$$\sqrt{x_{max} \cdot y_{max}} - \sqrt{x_{min} \cdot y_{min}} < \frac{\sqrt{x_{max}}}{z_{min}} - \frac{\sqrt{x_{min}}}{z_{max}}$$

That is, if this condition is satisfied, an overcurrent detection circuit in accordance with a first exemplary embodiment of the present invention can exhibit an improvement in accuracy over the related-art circuit.

Note that even when the electrical power supply to the load 2 is controlled to the Off-state by the transistor Q1 in the circuit shown in FIG. 1, a current could flow from the power-supply voltage terminal 1 to the load 2 on the current path through the transistors Q6, Q3 and Q5. To prevent such a current leak, the circuit can be modified as appropriate to a circuit configuration shown in FIG. 4 in which an additional PMOS transistor (switch element) SW1 is provided on the above-described current path. The source of the transistor SW1 is connected through the input terminal 3 to the power-supply voltage terminal 1. The drain of the transistor SW1 is connected to the drain of the transistor Q6. The gate of the transistor SW1 is connected to a voltage control signal S1. The remaining circuit configuration is similar to that of the circuit shown in FIG. 1, and therefore its explanation is omitted.

The voltage control signal S1 is changed in its voltage level according to a control signal output from the control circuit 5. For example, when the transistor Q1 is controlled to the Off-state, the current flowing between the source and drain of the transistor SW1 is also controlled to the Off-state. With a circuit configuration like this, the switching between On/Off states of the current flowing through the transistor SW1 is controlled at the same moment when the On/Off state of the electrical power supply to the load 2 is controlled by the transistor Q1. Note that although a PMOS transistor is used for the transistor SW1 in the circuit shown in FIG. 4, the present invention is not limited to this configuration and other switch elements capable of controlling the switching between On/Off states of the current may be also used.

Figure 4:
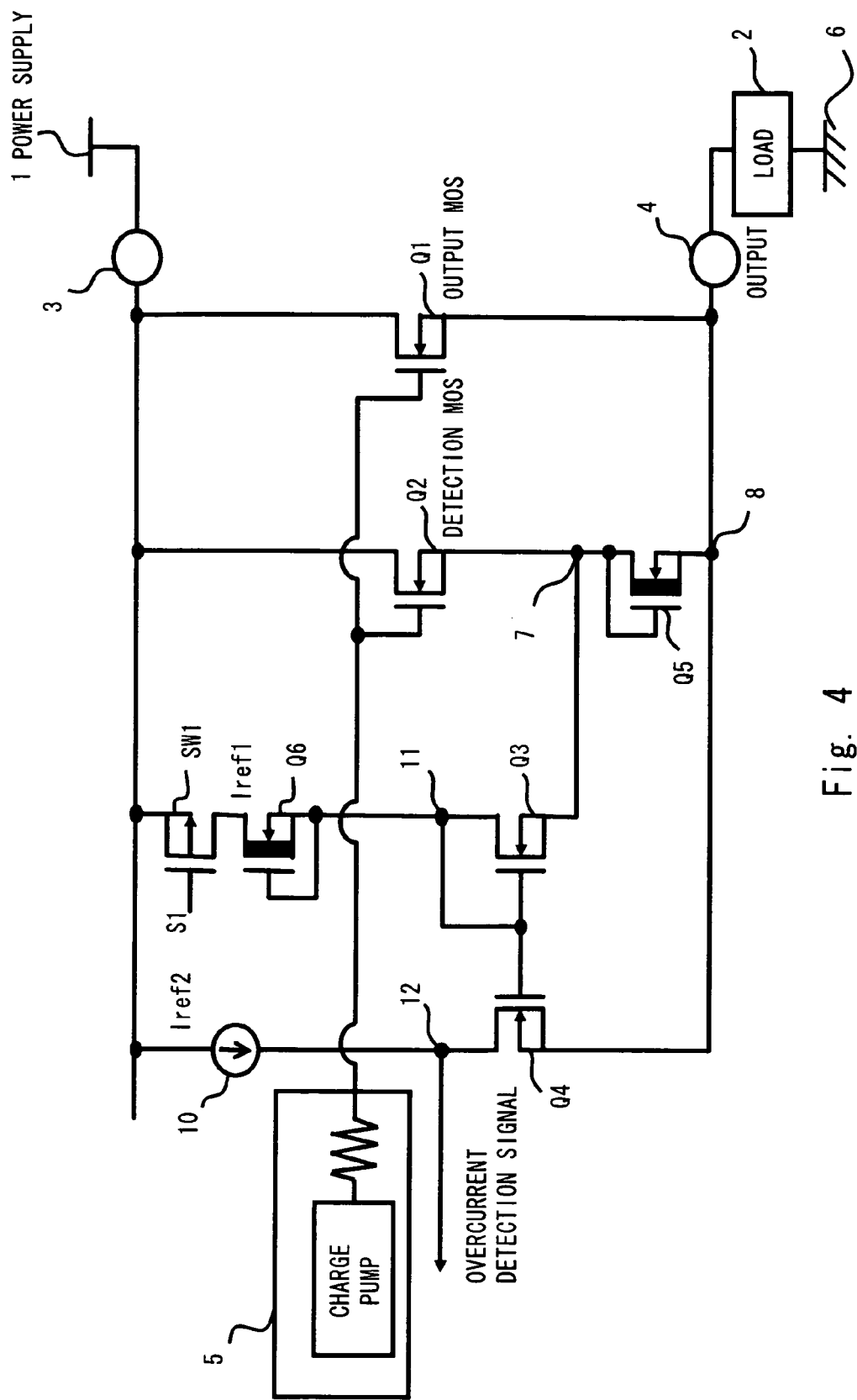
FIG. 4 shows an overcurrent detection circuit in accordance with a first exemplary embodiment of the present invention.

Furthermore, although an example in which the transistor SW1 is arranged between the input terminal 3 and the drain of the transistor Q6 is illustrated in the circuit shown in FIG. 4, the present invention is not limited to this configuration. A transistor SW1 may be arranged in any place on the current path through which a current flows from the power-supply voltage terminal 1 through the transistors Q6, Q3 and Q5 to the load 2. However, in such a case, it is necessary to configure an overcurrent detection circuit with taking the characteristics of the transistor SW1 into consideration.

Figure 5:
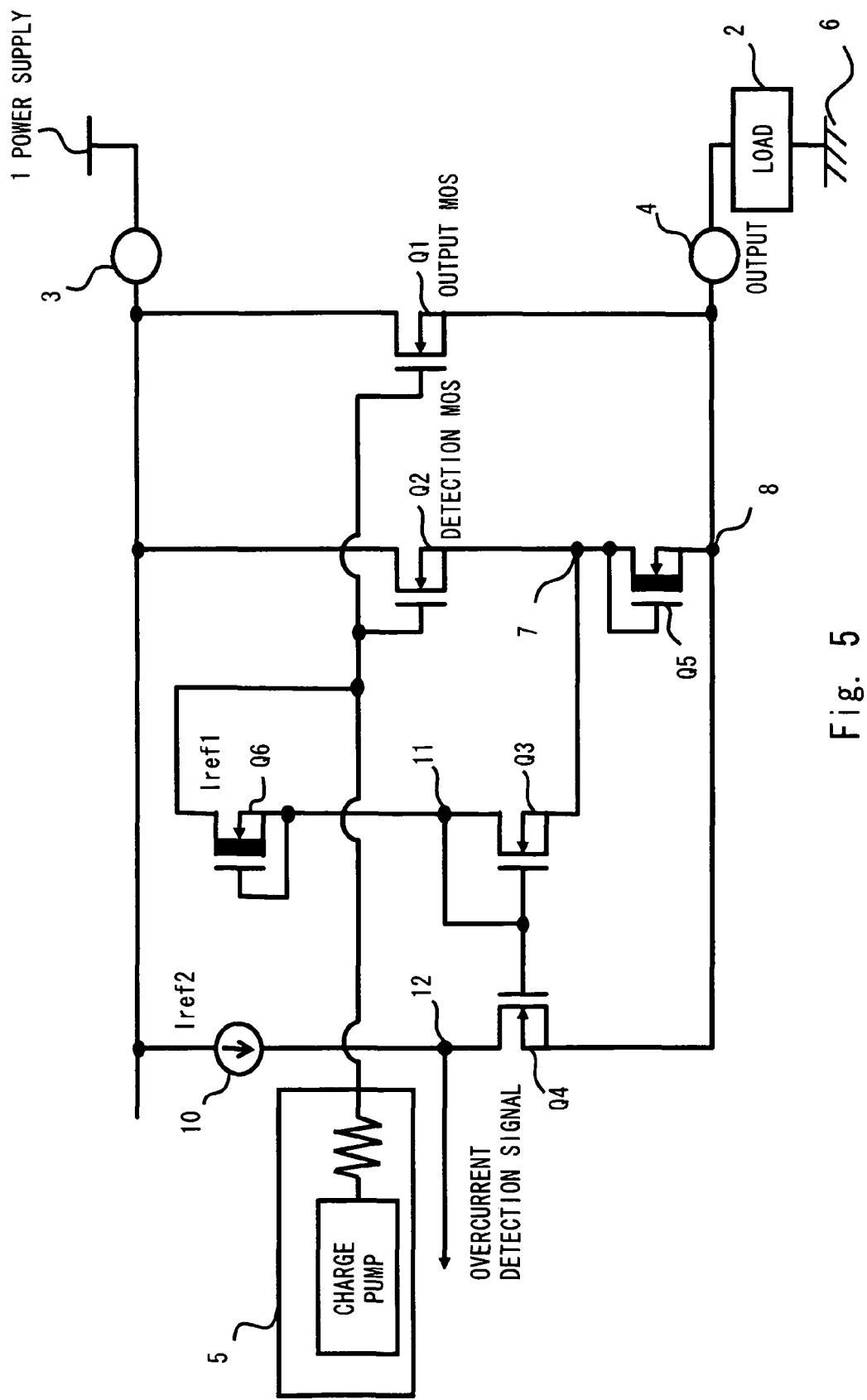
FIG. 5 shows an overcurrent detection circuit in accordance with a first exemplary embodiment of the present invention.

Furthermore, the problem in the circuit shown in FIG. 1 that when the electrical power supply to the load 2 is controlled to the Off-state by the transistor Q1, a current could flow from the power-supply voltage terminal 1 to the load 2 through the transistors Q6, Q3 and Q5 can be also solved by adopting a circuit shown in FIG. 5. That is, instead of inputting the power-supply voltage, a control signal output from the control circuit 5 is input to the drain of the transistor Q6 as shown in FIG. 5. With a circuit configuration like this, the current flowing through the transistor Q6 is controlled to the Off-state at the same moment when the transistor Q1 is controlled to the Off-state according to the control signal output from the control circuit 5. Note that a circuit configuration described above in which the switching between On/Off states of the current flowing from the power-supply voltage terminal 1 to the load 2 through the transistors Q6, Q3 and Q5 is controlled can be also applied to other exemplary embodiments of the present invention described below. Further, a similar circuit configuration can be also applied as appropriate to the current path through the threshold current output means 10. By doing so, the current flow to the load 2 through the threshold current output means 10 can be also prevented.

Second Exemplary Embodiment

Figure 6:
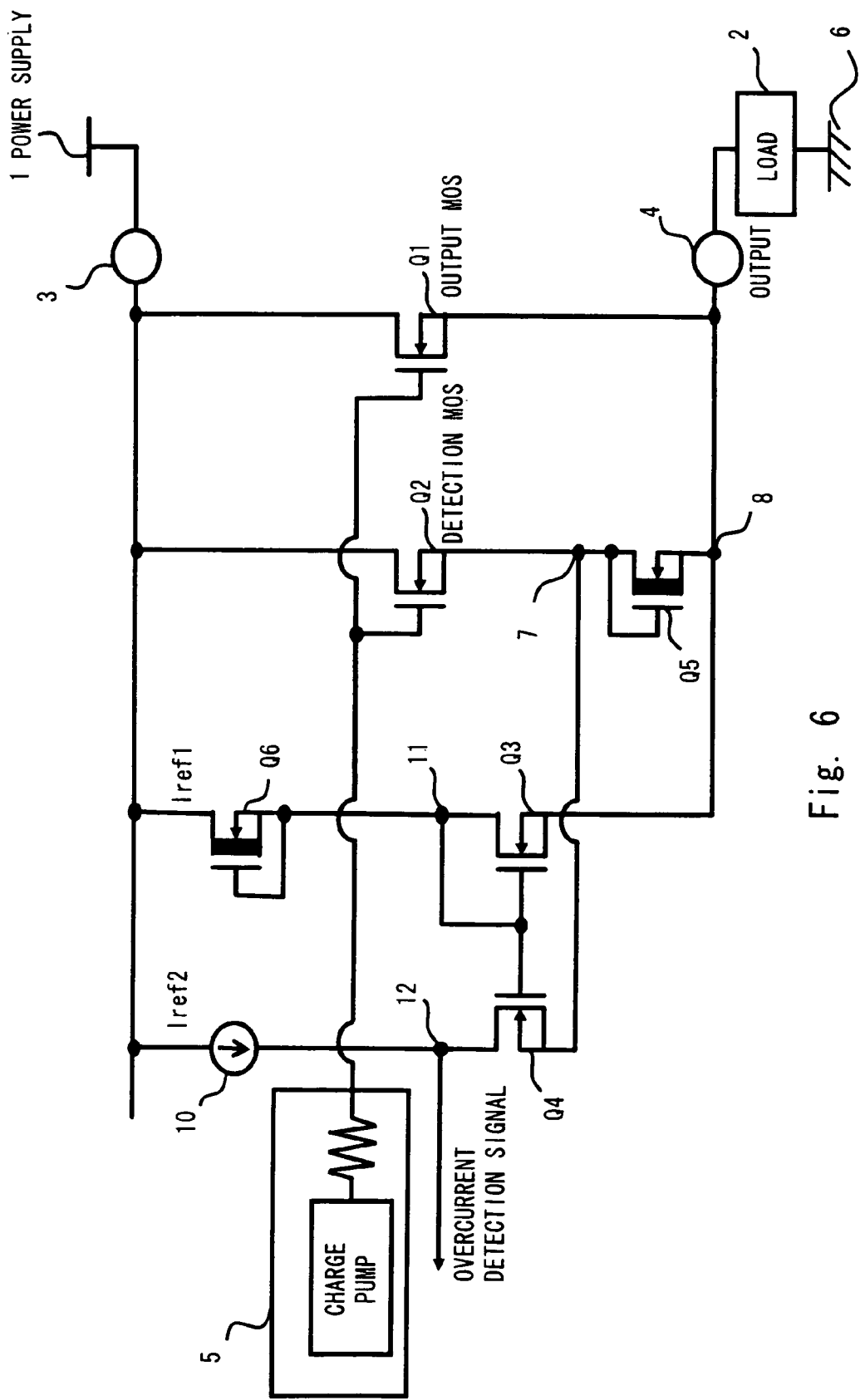
FIG. 6 shows an overcurrent detection circuit in accordance with a second exemplary embodiment of the present invention.

FIG. 6 shows an overcurrent detection circuit in accordance with a second exemplary embodiment of the present invention. As shown in FIG. 1, the drain and gate of the transistor Q5 are connected to the source of the transistor Q3, and the source of the transistor Q5 is connected to the source of the transistor Q4. In contrast to that, in the circuit shown in FIG. 6, the drain and gate of the transistor Q5 is connected to the source of the transistor Q4, and the source of the transistor Q5 is connected to the source of the transistor Q3. The remaining circuit configuration is similar to that of the circuit shown in FIG. 1, and therefore its explanation is omitted.

Since the transistors Q1 and Q2 are structurally similar to each other, a current flowing through the transistor Q2 increases with the increase in a current flowing through the transistor Q1 based on the homothetic ratio between the transistors Q1 and Q2 (for example, if the current flowing through the transistor Q1 is 10 A and the homothetic ratio is 10000:1, the current flowing through the transistor Q2 becomes 10 A/10000=1 mA). As a result, the potential Vs at the node 7 rises. That is, when the transistor Q4 is turned on, the current flowing therethrough becomes smaller. Note that the transistors Q3 and Q4 are structurally similar to each other.

If the current flowing between the source and drain of this transistor Q4 is lower than the threshold current Iref2 (e.g., 50 uA) established by the threshold current output means 10, the overcurrent detection signal output through the node 12 is inverted from the low level to the high level. Therefore, the overcurrent detection circuit shown in FIG. 6 can determine that the current flowing into the load is in an overcurrent state.

On the other hand, when the current flowing through the transistor Q1 is small, the current that flows when the transistor Q4 is turned on becomes larger than the threshold current Iref2. At this time, the overcurrent detection signal output through the node 12 remains in the low-level state. Therefore, the overcurrent detection circuit shown in FIG. 6 can determine that the current flowing into the load is not in an overcurrent state. The remaining circuit configuration is similar to that of the circuit shown in FIG. 1, and therefore its explanation is omitted.

The degree of improvement in a case where the circuit shown in FIG. 6 includes a GS-shorted depletion MOS transistor Q6 as a constant-current output means is explained hereinafter. Assume that the current flowing through Q1 is Ioc, the current flowing through Q2 is Isense, the homothetic ratio between Q1 and Q2 is A:1, the channel length of Q3 is L1, the channel width of Q3 is w1, the channel length of Q4 is L2, the channel width of Q4 is w2, the threshold voltage of Q3 and Q4 is Vt, the mobility of electrons is $\mu$, and the oxide film capacitance per unit area is Cox. Note that Isense is sufficiently larger than Iref1. In the circuit of FIG. 6, the current value Ioc detected by the overcurrent detection circuit can be expressed by the following Equation (1-b).

$$V1 = Isense \cdot Rs + \sqrt{\frac{2L2}{\mu \cdot Cox \cdot w2} Iref2} + Vt$$

$$= \sqrt{\frac{2L1}{\mu \cdot Cox \cdot w1} Iref1} + Vt$$

$$Isense = \frac{1}{Rs}\sqrt{\frac{2}{\mu \cdot Cox}}\left(\sqrt{\frac{L1}{w1} Iref1} - \sqrt{\frac{L2}{w2} Iref2}\right)$$

Since Ioc=A·Isense, the following equation is obtained.

$$Ioc = \frac{A}{Rs}\sqrt{\frac{2}{\mu \cdot Cox}}\left(\sqrt{\frac{L1}{w1} Iref1} - \sqrt{\frac{L2}{w2} Iref2}\right) \quad (1\text{-}b)$$

Assuming that, in Equation (1-b), the variation coefficient of Iref1 is x, the variation coefficient of Iref2 is y, and the variation coefficient of Rs is z, it can be expressed as the following Equation (2-b).

$$Ioc = \frac{A}{Rs \cdot z}\sqrt{\frac{2}{\mu \cdot Cox}}\left(\sqrt{\frac{L1}{w1} Iref1 \cdot x} - \sqrt{\frac{L2}{w2} Iref2 \cdot y}\right) \quad (2\text{-}b)$$

From the relation between Q5 and Q6 as shown in the first exemplary embodiment of the present invention, the following equation is established.

$$z = \frac{1}{\sqrt{x}}$$

Therefore, Equation (2-b) expressing the current value Ioc detected by the overcurrent detection circuit can be expressed as follows.

$$Ioc(x, y) = \frac{A \cdot \sqrt{x}}{Rs}\sqrt{\frac{2}{\mu \cdot Cox}}\left(\sqrt{\frac{L1}{w1} Iref1 \cdot x} - \sqrt{\frac{L2}{w2} Iref2 \cdot y}\right)$$

$$Ioc(x, y) = \frac{A}{Rs}\sqrt{\frac{2}{\mu \cdot Cox}}\left(\sqrt{\frac{L1}{w1} Iref1} \cdot x - \sqrt{\frac{L2}{w2} Iref2} \cdot \sqrt{x \cdot y}\right)$$

Assume the following relation.

$$\gamma = \frac{A}{Rs}\sqrt{\frac{2}{\mu \cdot Cox}}, \; \alpha = \sqrt{\frac{L2}{w2} Iref2}, \; \beta = \sqrt{\frac{L1}{w1} Iref1}$$

Then, the following equation is established.

$$Ioc(x,y) = \gamma(\beta \cdot x - \alpha\sqrt{x \cdot y})$$

Therefore, the variation coefficient of Ioc can be expressed as follows.

$$\frac{Ioc(x, y)}{Ioc(1, 1)} = \frac{\gamma(\beta \cdot x - \alpha\sqrt{x \cdot y})}{\gamma(\beta - \alpha)}$$

Assuming the relation $\beta/\alpha=n$, it can be expressed as follows.

$$\frac{Ioc(x, y)}{Ioc(1, 1)} = \frac{x - \frac{\sqrt{x \cdot y}}{n}}{1 - \frac{1}{n}}$$

If a relation $\beta > \alpha$ is satisfied, i.e., if n is sufficiently large, it can be approximated by the following equation.

$$\frac{Ioc(x, y)}{Ioc(1, 1)} \approx x \quad (4\text{-}b)$$

In this example, if each component has a variation within ±20%, i.e., if the variations occur within a range of x=0.8-1.2 and y=0.8-1.2, the maximum value and the minimum value of the variation coefficient of Ioc can be expressed as follows.

$$\text{maximum value:} \frac{Ioc(x, y)}{Ioc(1, 1)} = 1.2$$

$$\text{minimum value:} \frac{Ioc(x, y)}{Ioc(1, 1)} = 0.8$$

That is, the current value Ioc detected by the overcurrent detection circuit (the overcurrent detection value) exhibits variations within a range of +20.0% to −20.0% (variation width=40.0%). As described above, the variation width of the related-art circuit shown in FIG. 9 is 62.4%. Therefore, the variation width of an overcurrent detection circuit in accordance with a second exemplary embodiment of the present invention is improved in the accuracy over that of the related art by 22.4%.

The prerequisite for achieving the improvement in accuracy of the circuit shown in FIG. 6 over the related-art circuit shown in FIG. 9 is summarized hereinafter. Assume the minimum value is xmin and the maximum value is xmax for the common variation coefficient x of Iref1. Assume also the minimum value is ymin and the maximum value is ymax for the common variation coefficient y of Iref2. Assume also the minimum value is zmin and the maximum value is zmax for the variation coefficient z of Rs. Then, the maximum value, the minimum value, and variation width of the variation coefficient of Ioc in the related-art circuit shown in FIG. 9 can be expressed as follows.

$$\text{maximum value:} \frac{\sqrt{x_{max}}}{z_{min}},$$

$$\text{minimum value:} \frac{\sqrt{x_{min}}}{z_{max}},$$

$$\text{variation width:} \frac{\sqrt{x_{max}}}{z_{min}} - \frac{\sqrt{x_{min}}}{z_{max}}$$

Further, the maximum value, the minimum value, and variation width of the variation coefficient of Ioc in the circuit shown in FIG. 6 can be expressed as follows.

$$\text{maximum value: } x_{max},$$

$$\text{minimum value: } x_{min},$$

$$\text{variation width: } x_{max} - x_{min}$$

Therefore, the prerequisite for achieving the improvement in accuracy of the overcurrent detection circuit in accordance with a second exemplary embodiment of the present invention over the related-art circuit is expressed as follows.

$$x_{max} - x_{min} < \frac{\sqrt{x_{max}}}{z_{min}} - \frac{\sqrt{x_{min}}}{z_{max}}$$

That is, if this condition is satisfied, an overcurrent detection circuit in accordance with a second exemplary embodiment of the present invention can exhibit an improvement in accuracy over the related-art circuit.

As described above, even when the connection of the GD-shorted depletion MOS transistor Q5 is changed as shown in FIGS. 1 and 6, it is still possible to improve the variation width. Furthermore, such a circuit configuration is similarly applied to other exemplary embodiments of the present invention described below.

Third Exemplary Embodiment

Figure 7:
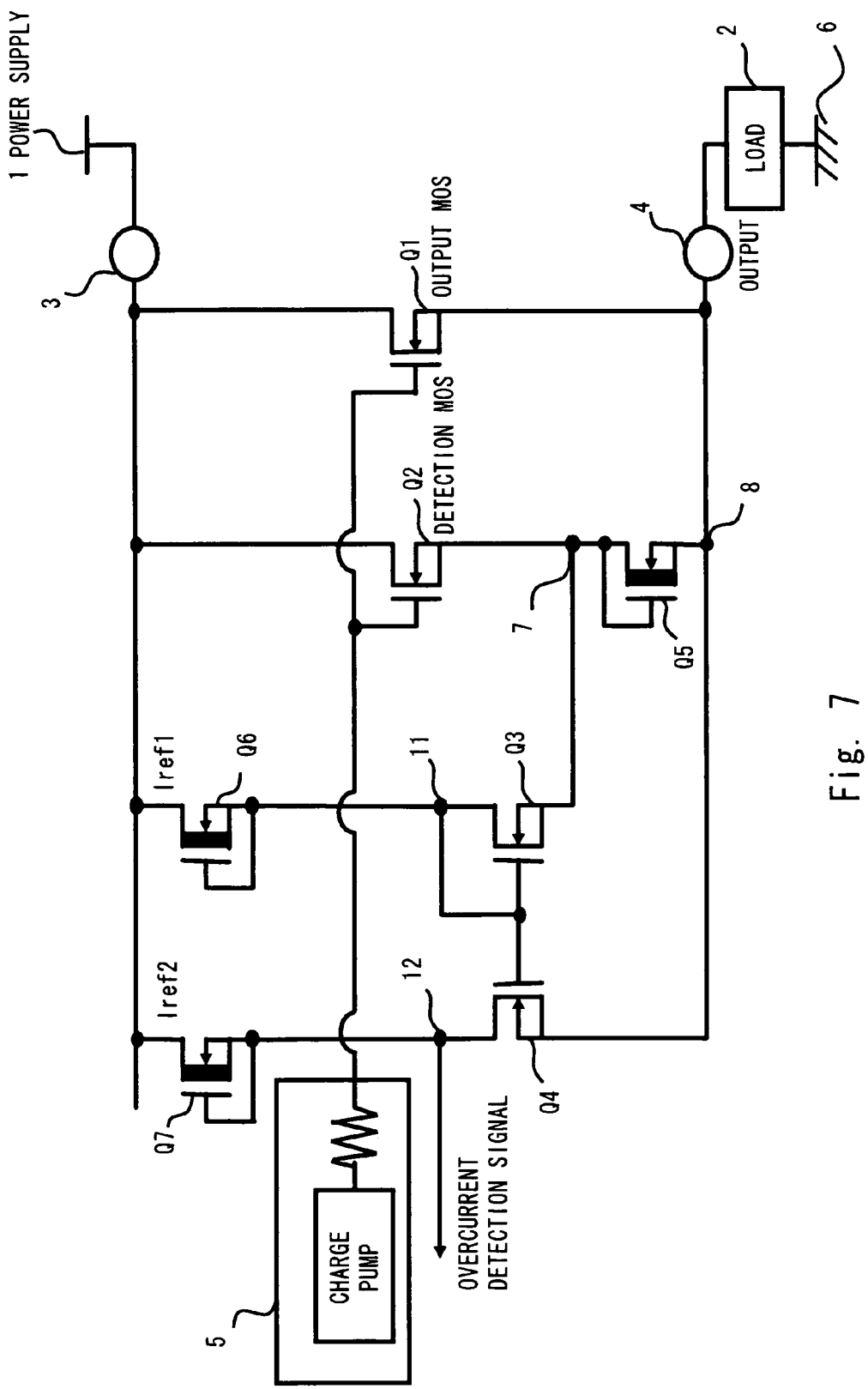
FIG. 7 shows an overcurrent detection circuit in accordance with a third exemplary embodiment of the present invention.

FIG. 7 shows an overcurrent detection circuit in accordance with a third exemplary embodiment of the present invention. The circuit shown in FIG. 7 includes a GS-shorted depletion MOS transistor (third depletion type transistor) Q7 that exhibits a constant-current characteristic as a threshold current output means 10. Note that the transistors Q7 and Q6 are structurally similar to each other. The power-supply voltage terminal 1 is connected through the input terminal 3 to the source of the transistor Q7. The gate and drain of the transistor Q7 is connected to the node 12. The remaining circuit configuration and the operations are similar to those of the circuit shown in FIG. 1, and therefore its explanation is omitted.

The circuit shown in FIG. 7 includes a GS-shorted depletion MOS transistor Q7 that is structurally similar to the transistor Q6 as a threshold current output means. Therefore, a relation x=y is satisfied in Equation (4) expressing the variation coefficient of Ioc. Therefore, the variation coefficient of Ioc in the circuit shown in FIG. 7 is expressed by the following equation.

$$\frac{Ioc(x)}{Ioc(1)} = x \qquad (5)$$

In this example, if each component has a variation within ±20%, i.e., if the variations occur within a range of x=0.8-1.2, the maximum value and the minimum value of the variation coefficient of Ioc become 1.2 and 0.8 respectively. That is, the current value Ioc detected by the overcurrent detected circuit (the overcurrent detection value) exhibits variations within a range of +20.0% to −20.0% (variation width=40.0%). As described above, the variation width of the related-art circuit shown in FIG. 9 is 62.4%. Therefore, the variation width of an overcurrent detection circuit in accordance with a third exemplary embodiment of the present invention is improved in the accuracy over that of the related art by 22.4%.

The prerequisite for achieving the improvement in accuracy of the circuit shown in FIG. 7 over the circuit shown in FIG. 9 is summarized hereinafter. Assume the minimum value is xmin and the maximum value is xmax for the common variation coefficient x of Iref1. Assume also the minimum value is ymin and the maximum value is ymax for the common variation coefficient y of Iref2. Assume also the minimum value is zmin and the maximum value is zmax for the variation coefficient z of Rs. Then, the maximum value, the minimum value, and variation width of the variation coefficient of Ioc in the circuit shown in FIG. 9 can be expressed as follows.

$$\text{maximum value}: \frac{\sqrt{x_{max}}}{z_{min}},$$

$$\text{minimum value}: \frac{\sqrt{x_{min}}}{z_{max}},$$

$$\text{variation width}: \frac{\sqrt{x_{max}}}{z_{min}} - \frac{\sqrt{x_{min}}}{z_{max}}$$

Further, the maximum value, the minimum value, and variation width of the variation coefficient of Ioc in the circuit shown in FIG. 7 can be expressed as follows.

maximum value: $x_{max}$, minimum value: $x_{min}$, variation width: $x_{max} - x_{min}$ Therefore, the prerequisite for achieving the improvement in accuracy of the overcurrent detection circuit in accordance with a third exemplary embodiment of the present invention over the related-art circuit is expressed as follows.

$$x_{max} - x_{min} < \frac{\sqrt{x_{max}}}{z_{min}} - \frac{\sqrt{x_{min}}}{z_{max}}$$

That is, if this condition is satisfied, an overcurrent detection circuit in accordance with a third exemplary embodiment of the present invention can exhibit an improvement in accuracy over the related-art circuit.

Fourth Exemplary Embodiment

Figure 8:
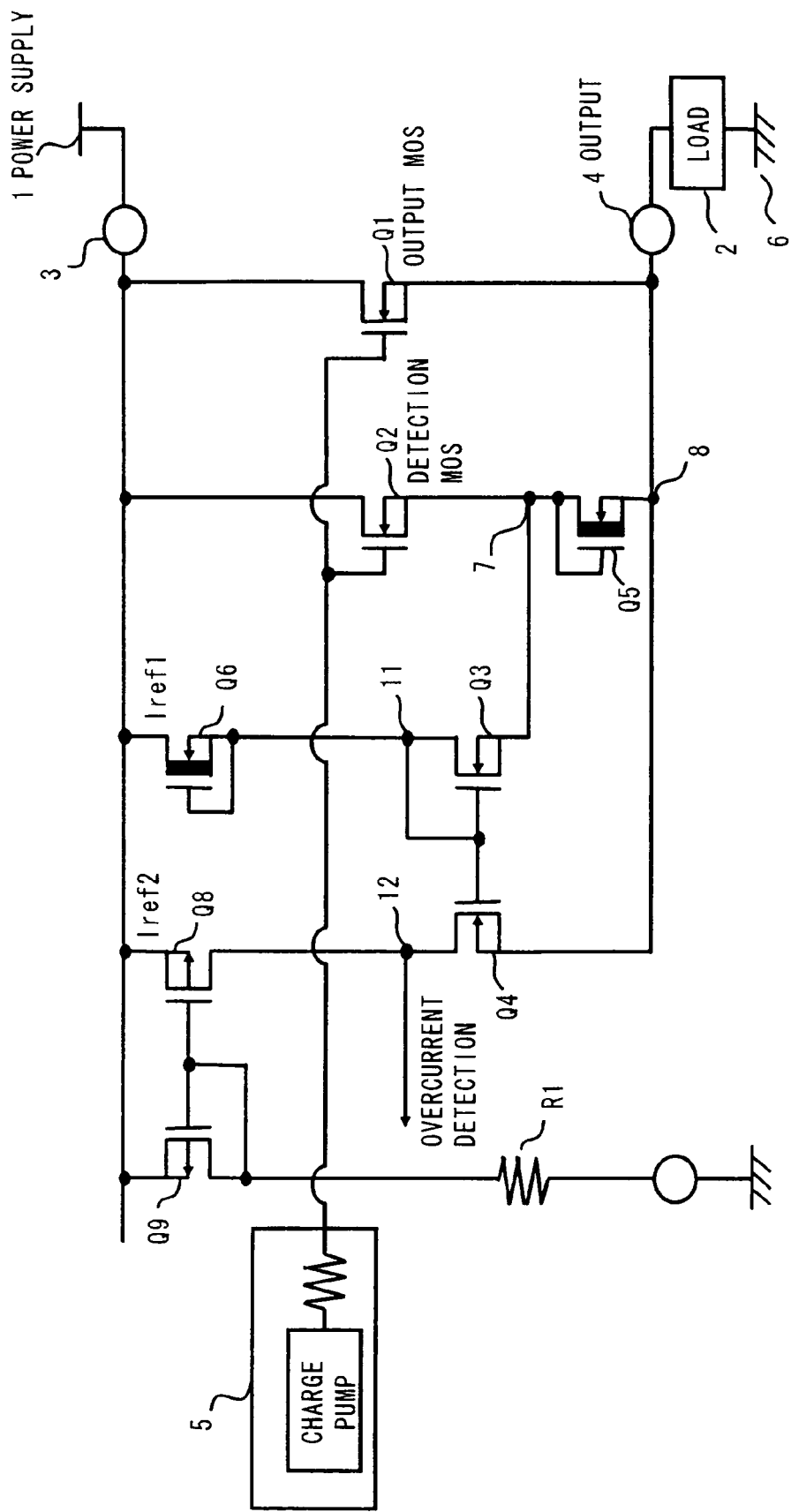
FIG. 8 shows an overcurrent detection circuit in accordance with a fourth exemplary embodiment of the present invention.

FIG. 8 shows an overcurrent detection circuit in accordance with a fourth exemplary embodiment of the present invention. The circuit shown in FIG. 8 includes a PMOS transistor (third transistor) Q8 as a threshold current output means 10. The circuit shown in FIG. 8 also includes another PMOS transistor Q9 (fourth transistor) and a resistive element (resistor) R1.

The power-supply voltage terminal 1 is connected through the input terminal 3 to the sources of the transistors Q8 and Q9. The drain of the transistor Q8 is connected to the node 12. The drain of the transistor Q9 is connected to the gates of the transistors Q9 and Q8, and one terminal of the resistive element R1. The other terminal of the resistive element R1 is connected to the ground voltage terminal 6. The remaining circuit configuration and the operations are similar to those of the circuit shown in FIG. 1, and therefore its explanation is omitted.

The circuit shown in FIG. 8 illustrates an example where a transistor Q8 that is not structurally similar to the transistor Q6 is provided. Note that the transistors Q8 and Q9 are connected so as to form a current-mirror circuit. Therefore, the current value Iref2 flowing between the source and drain of the transistor Q8 is changed according to the potential difference between the power-supply voltage terminal 1 and the ground voltage terminal 6. When the potential difference between the power-supply voltage terminal 1 and the ground voltage terminal 6 is large (e.g., 10V), Iref2 becomes larger (e.g., 50 uA). As a result, the value at which the current Ioc flowing to the transistor Q1 is determined to be an overcurrent also becomes larger (e.g., 10 A). On the other hand, when the potential difference between the power-supply voltage terminal 1 and the ground voltage terminal 6 is small (e.g., 5 V), Iref2 becomes smaller (e.g., 25 uA). As a result, the value at which the current Ioc flowing to the transistor Q1 is determined to be an overcurrent also becomes smaller (e.g., 5 A). That is, the current value Ioc to be determined as an overcurrent is changed according to the potential difference between the power-supply voltage terminal 1 and the ground voltage terminal 6. That is, the resistive component that is obtained from the current value Ioc to be determined as an overcurrent and the potential difference between the power-supply voltage terminal 1 and the ground voltage terminal 6 can be always maintained at a constant value (when the potential difference is 10V, it is 10V/10 A=1Ω, and when the potential difference is 5V, it is 5V/5 A=1Ω).

Next, a case where Iref2 remains unchanged (e.g., fixed at Iref2=50 uA) even when the potential difference between the power-supply voltage terminal 1 and the ground voltage terminal 6 is changed (e.g., 5V, 10V) in contrast to the circuit shown in FIG. 8 is explained hereinafter. In this case, the current value Ioc to be determined as an overcurrent is not changed according to the potential difference between the power-supply voltage terminal 1 and the ground voltage terminal 6. That is, the resistive component that is obtained from the current value Ioc to be determined as an overcurrent and the potential difference between the power-supply voltage terminal 1 and the ground voltage terminal 6 is changed (when the potential difference is 5V, it is 5V/10 A=0.5Ω, and when the potential difference is 10V, it is 10V/10 A=1Ω). For example, the resistive component decreases with the decrease in the potential difference between the power-supply voltage terminal 1 and the ground voltage terminal 6.

When designing systems equipped with IPDs, it is sometimes required to maintain the resistive component obtained from the current value Ioc to be determined as an overcurrent and the potential difference between the power-supply voltage terminal 1 and the ground voltage terminal 6 at a fixed value. In such a case, a circuit configuration shown in a fourth exemplary embodiment of the present invention may be used.

It should be noted that in the related-art circuit shown in FIG. 9, the constant-current output means 9, which outputs Iref1, and the threshold current output means 10, which outputs Iref2, are structurally similar to each other. Therefore, unlike the circuit shown in FIG. 8, it is very difficult to control Iref2 according to the potential difference between the power-supply voltage and the ground voltage in the circuit shown in FIG. 9.

By contrast, the transistor Q6, which outputs Iref1, and the transistor Q8, which outputs Iref2, are not necessarily structurally similar to each other. Therefore, it is easy to control Iref2 according to the potential difference between the power-supply voltage and the ground voltage. Furthermore, even if a variation occurs in each of the transistors Q6 and Q8, it is still possible to reduce errors in the overcurrent detection value as shown in the first to third exemplary embodiments of the present invention.

Note that although PMOS transistors are used for the transistors Q8 and Q9 in a fourth exemplary embodiment, the present invention is not limited to them. For example, various transistors including a bipolar transistor and the like capable of controlling their currents may be used.

As has been described so far, an overcurrent detection circuit in accordance with the above-described exemplary embodiments of the present invention includes a GS-shorted depletion MOS transistor as a constant-current output means 9, and a GD-shorted depletion MOS transistor that is structurally similar to the transistor used as the constant-current output means 9 as a detection resistor Rs. With such a configuration, it is possible to improve the circuit in terms of errors in overcurrent detection values cause by variations in the characteristics of each component.

The first, second, third, and fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An overcurrent detection circuit comprising:
   a detection transistor whose current value is controlled according to a control voltage applied to a gate terminal of an output transistor, the output transistor being configured to control an electrical power supply to a load;
   a potential difference setting unit for which a potential difference of output voltages is controlled according to the current value of the detection transistor; and
   a first transistor whose current value is controlled according to a potential difference between its gate and source terminals, the potential difference between the gate and source terminals of the first transistor being controlled by the potential difference setting unit,
   wherein the overcurrent detection circuit detects an overcurrent based on the current value of the first transistor, and the potential difference setting unit comprises:
      a first depletion type transistor, a supply voltage being applied to a drain terminal of the first depletion type transistor, and gate and source terminals of the first depletion type transistor being connected to the gate terminal of the first transistor;
      a second transistor, drain and gate terminals of the second transistor being connected to a node between the gate and source terminals of the first depletion type transistor and the gate terminal of the first transistor; and
      a second depletion type transistor provided on a current path between the source terminal of the first transistor and the source terminal of the second transistor, gate and drain terminals of the second depletion type transistor being connected to a source terminal of the detection transistor, and a source terminal of the second depletion type transistor being connected to an output terminal to the load.

2. The overcurrent detection circuit according to claim 1, wherein the gate terminal and the source terminal of the first depletion type transistor are connected to each other, so that the first depletion type transistor has a constant-current characteristic in a current between its drain and source terminals,
   wherein the gate terminal and the drain terminal of the second depletion type transistor are connected to each other, so that the second depletion type transistor has a resistance characteristic between its drain and source terminals, and
   wherein the first and second depletion type transistors are constructed from components structurally similar to each other.

3. The overcurrent detection circuit according to claim 1, further comprising a threshold current output unit,
   wherein the threshold current output unit comprises a third depletion type transistor, the supply voltage being applied to a drain terminal of the third depletion type transistor, and gate and source terminals of the third depletion type transistor being connected to the drain terminal of the first transistor, and
   wherein the first and third depletion type transistors respectively generate and output their currents flowing between their drain and source terminals based on the supply voltage.

4. The overcurrent detection circuit according to claim 1, further comprising a threshold current output unit,
   wherein the threshold current output unit comprises:
      a third transistor, the supply voltage being applied to a source terminal of the third transistor, and a drain terminal of the third transistor being connected to the drain terminal of the first transistor; and
      a fourth transistor, the supply voltage being applied to a source terminal of the fourth transistor, and gate and drain terminals of the fourth transistor being connected to a ground voltage terminal through a resistor, and to a gate terminal of the third transistor, and
   wherein a current flows between the source and drain terminals of the third transistor according to a current between the source and drain terminals of the fourth transistor, the current between the source and drain terminals of the fourth transistor being determined based on a potential difference between the supply voltage and a ground voltage.

5. The overcurrent detection circuit according to claim 1, wherein the supply voltage comprises an externally-supplied power-supply voltage.

6. The overcurrent detection circuit according to claim 1, further comprising a switch element that controls the supply voltage supplied to the potential difference setting unit,
   wherein the switch element controls switching between On/Off states of a supply of the supply voltage based on the control voltage.

7. The overcurrent detection circuit according to claim 3, further comprising a switch element that controls the supply voltage supplied to the potential difference setting unit and the threshold current output unit,
   wherein the switch element controls switching between On/Off states of a supply of the supply voltage based on the control voltage.

8. The overcurrent detection circuit according to claim 1, wherein the supply voltage supplied to the potential difference setting unit comprises a voltage according to the control voltage.

9. The overcurrent detection circuit according to claim 3, wherein the supply voltage supplied to the potential difference setting unit and the threshold current output unit comprises a voltage according to the control voltage.

10. A load drive circuit comprising:
    the overcurrent detection circuit and the output transistor according to claim 1; and
    a control circuit that controls switching between On/Off states of a current between a drain and source terminals of the output transistor by applying a control current to the gate terminal of the output transistor.

11. The overcurrent detection circuit according to claim 1, wherein the first depletion type transistor and the second depletion type transistor are constructed from components structurally similar to each other.

12. The overcurrent detection circuit according to claim 3, wherein the first to third depletion type transistors are constructed from components structurally similar to each other.

13. The overcurrent detection circuit according to claim 1, further comprising a third transistor comprising a source terminal connected to the drain terminal of the first depletion type transistor.

14. The overcurrent detection circuit according to claim 13, wherein the source terminal of the third transistor is configured to receive the supply voltage.

15. The overcurrent detection circuit according to claim 13, further comprising a fourth transistor comprising a gate terminal that is connected to a gate terminal of the third transistor.

16. The overcurrent detection circuit according to claim 1, wherein the source terminal of the first transistor is connected to the drain terminal of the second depletion type transistor.

17. The overcurrent detection circuit according to claim 1, wherein the source terminal of the first transistor is connected to the source terminal of the second depletion type transistor.

18. The overcurrent detection circuit according to claim 17, wherein the source terminal of the second transistor is connected to the drain terminal of the second depletion type transistor.

* * * * *